(12) United States Patent
Liao

(10) Patent No.: US 6,392,165 B1
(45) Date of Patent: May 21, 2002

(54) ADAPTER FOR A BALL GRID ARRAY DEVICE

(75) Inventor: Sheng-Ji Liao, Taipei (TW)

(73) Assignee: Witek Enterprise Co., Ltd., Taipei (TW)

( * ) Notice: Subject to any disclaimer, the term of this patent is extended or adjusted under 35 U.S.C. 154(b) by 0 days.

(21) Appl. No.: 09/939,234

(22) Filed: Aug. 24, 2001

Related U.S. Application Data

(62) Division of application No. 09/366,812, filed on Aug. 4, 1999, now Pat. No. 6,326,560.

(51) Int. Cl.[7] ................................................. H01R 9/09
(52) U.S. Cl. ..................... 174/262; 174/260; 174/265; 361/768
(58) Field of Search .......................... 257/779; 174/260, 174/262, 263, 264, 265, 266; 361/767, 768, 771, 785, 786, 790

(56) References Cited

U.S. PATENT DOCUMENTS

| 3,148,310 A | * | 9/1964 | Feldman | |
| 5,702,255 A | | 12/1997 | Murphy et al. | |
| 5,742,481 A | | 4/1998 | Murphy et al. | |
| 5,812,378 A | * | 9/1998 | Fjelstad et al. | 361/796 |
| 5,825,630 A | * | 10/1998 | Taylor et al. | 361/790 |
| 5,936,843 A | * | 8/1999 | Ohshima et al. | 361/760 |
| 6,326,560 B1 | * | 12/2001 | Liao | 174/262 |

* cited by examiner

Primary Examiner—Kamand Cuneo
(74) Attorney, Agent, or Firm—Fish & Richardson P.C.

(57) ABSTRACT

An adapter is provided for mounting a ball grid array device on a pin-type integrated circuit socket, and includes a base plate and an interfacing plate. The base plate has a device mounting side formed with a plurality of solder pads thereon. The base plate is further formed with a plurality of upper through holes, each of which corresponds to one of the solder pads. The interfacing plate is formed with a plurality of lower through holes that correspond respectively with the upper through holes and are coaxial therewith. The interfacing plate further has a socket confronting side with a plurality of insert pins depending therefrom. Electrical conductors are provided on the base plate and the interfacing plate for connecting electrically and respectively the solder pads and the insert pins via the upper and lower through holes.

5 Claims, 5 Drawing Sheets

ADAPTER FOR A BALL GRID ARRAY DEVICE

CROSS-REFERENCE TO RELATED APPLICATION

Pursuant to 35 U.S.C. §120, this application is a divisional application of, and claims priority from U.S. application Ser. No. 09/366,812 filed Aug. 4, 1999, now U.S. Pat. No. 6,326,560 B1.

BACKGROUND OF THE INVENTION

1. Field of the Invention

The invention relates to ball grid array devices, more particularly to an adapter for a ball grid array device.

2. Description of the Related Art

The central processing unit (CPU) of most computers is generally used with an integrated circuit socket for establishing electrical connection with a computer motherboard. Because most commercially available integrated circuit sockets comply with a certain standard, they are only suitable for use with specific types of central processing units. In other words, due to differences in the specifications of central processing units made by different manufacturers, current central processing units are not adopted for use with a wide variety of integrated circuit sockets, thereby inconveniencing computer manufacturers.

In addition, pin grid array (PGA) packaging currently employed for central processing units is being gradually replaced by ball grid array (BGA) packaging. Since BGA devices generally adopt surface mounting techniques for installation on a circuit board, replacement after installation is often difficult to conduct. Moreover, it is difficult to inspect visually and repair poor connection between a BGA device and a circuit board after the former has been mounted on the latter.

SUMMARY OF THE INVENTION

Therefore, the main object of the present invention is to provide an adapter for mounting a ball grid array device on a pin-type integrated circuit socket.

Another object of the present invention is to provide an adapter of the aforesaid type, which facilitates visual inspection and repair of poor connection with a ball grid array device.

Accordingly, the adapter of the present invention is adapted for mounting a ball grid array device on a pin-type integrated circuit socket. The ball grid array device is formed with a plurality of solder balls, while the integrated circuit socket is formed with a plurality of pin holes and is provided with a plurality of board mounting pins that are disposed in the pinholes. The adapter comprises:

a base plate having a device mounting side formed with a plurality of solder pads thereon, the solder pads corresponding to and being adapted for surface mounting of the solder balls of the ball grid array device thereon, the base plate being further formed with a plurality of upper through holes, each of which corresponds to one of the solder pads;

an interfacing plate formed with a plurality of lower through holes that correspond respectively with the upper through holes, the interfacing plate further having a socket confronting side with a plurality of insert pins depending therefrom, the insert pins corresponding to and being adapted for insertion into the pin holes in the integrated circuit socket in order to establish electrical contact with the board mounting pins; and electrical conducting means provided on the base plate and the interfacing plate for connecting electrically and respectively the solder pads and the insert pins via the upper and lower through holes.

As such, the ball grid array device can be used with the integrated circuit socket even if the solder pad configuration of the former differs from the pin configuration of the latter.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
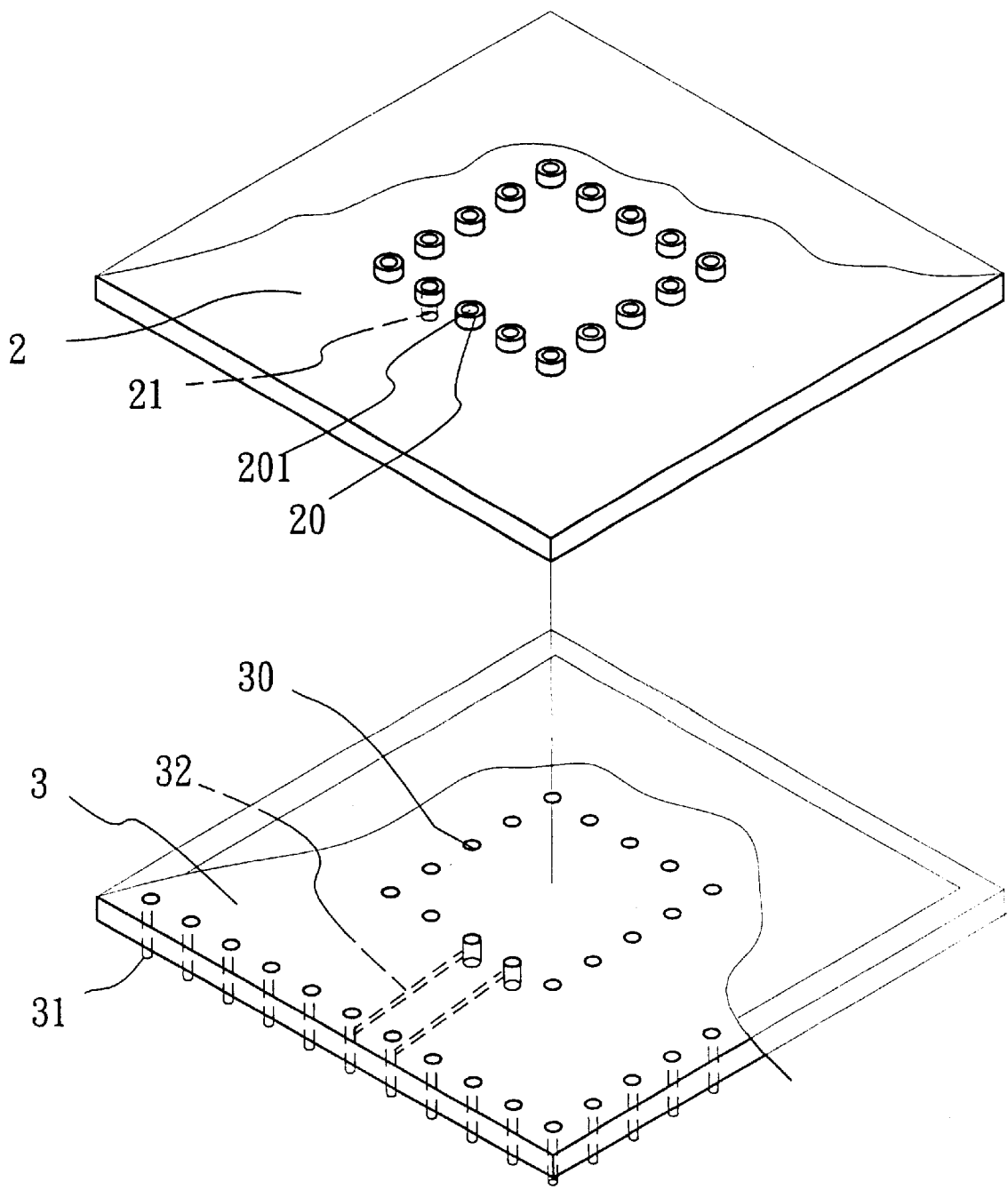
FIG. 1 is an exploded perspective view illustrating the first preferred embodiment of an adapter for a ball grid array device in accordance with the present invention.

Before the present invention is described in greater detail, it should be noted that like elements are denoted by the same reference numerals throughout the disclosure.

Referring to FIG. 1, the first preferred embodiment of an adapter according to the present invention is shown to comprise a base plate 2 and an interfacing plate 3. The plates 2, 3 may be a single-layer or multi-layer circuit board.

The base plate 2 has a device mounting side formed with a plurality of solder pads 20 thereon. The solder pads 20 correspond to and are adapted for mounting of solder balls 40 of a ball grid array device 4 (see FIG. 3) thereon via known surface mounting techniques. Each of the solder pads 20 is annular in shape and confines a pad hole 201 therein. The base plate 2 is further formed with a plurality of upper through holes 21 that are coaxial with the pad holes 201 in the solder pads 20.

The interfacing plate 3 is formed with a plurality of lower through holes 30 that are coaxial with the upper through holes 21. The interfacing plate 3 further has a socket confronting side with a plurality of insert pins 31 depending therefrom. The insert pins 31 correspond to and are adapted for insertion into pin holes 60 in an integrated circuit socket 6 in order to establish electrical contact with board mounting pins 61 that are disposed in the latter(see FIG. 3). Each of the insert pins 31 is connected to one end of a corresponding conductor 32 on the interfacing plate 3. The other end of each conductor 32 extends into a respective one of the lower through holes 30.

Figure 2:
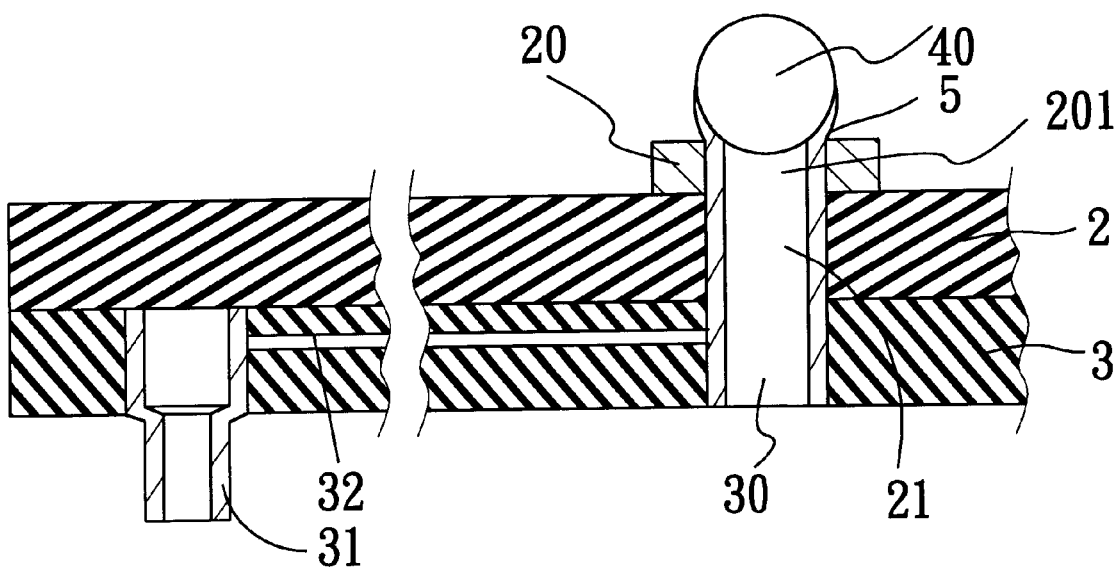
FIG. 2 is a fragmentary sectional view illustrating how connection with a solder ball of a ball grid array device is established in the first preferred embodiment.

Referring to FIG. 2, the conductor 32 is embedded in the interfacing plate 3. The base plate 2 is mounted on the interfacing plate 3 using known board mounting techniques. When a solder ball 40 of the ball grid array device 4 (see FIG. 3), such as a central processing unit, is mounted on the respective solder pad 20 with the use of solder paste 5, solder melt will form a conductive coating on the walls of the coaxial holes 201, 21, 30 by virtue of gravity and will establish electrical connection between the solder pad 20 and a respective one of the insert pins 31 via a respective one of the conductors 32. Due to the presence of the holes 201, 21, 30, the solder balls 40 are visible from the socket confronting side of the interfacing plate 3, thereby facilitating visual inspection to detect poor connection with the ball grid array device 4 (see FIG. 3). Repair of poor connections is also possible via the 201, 21, 30.

Figure 3:
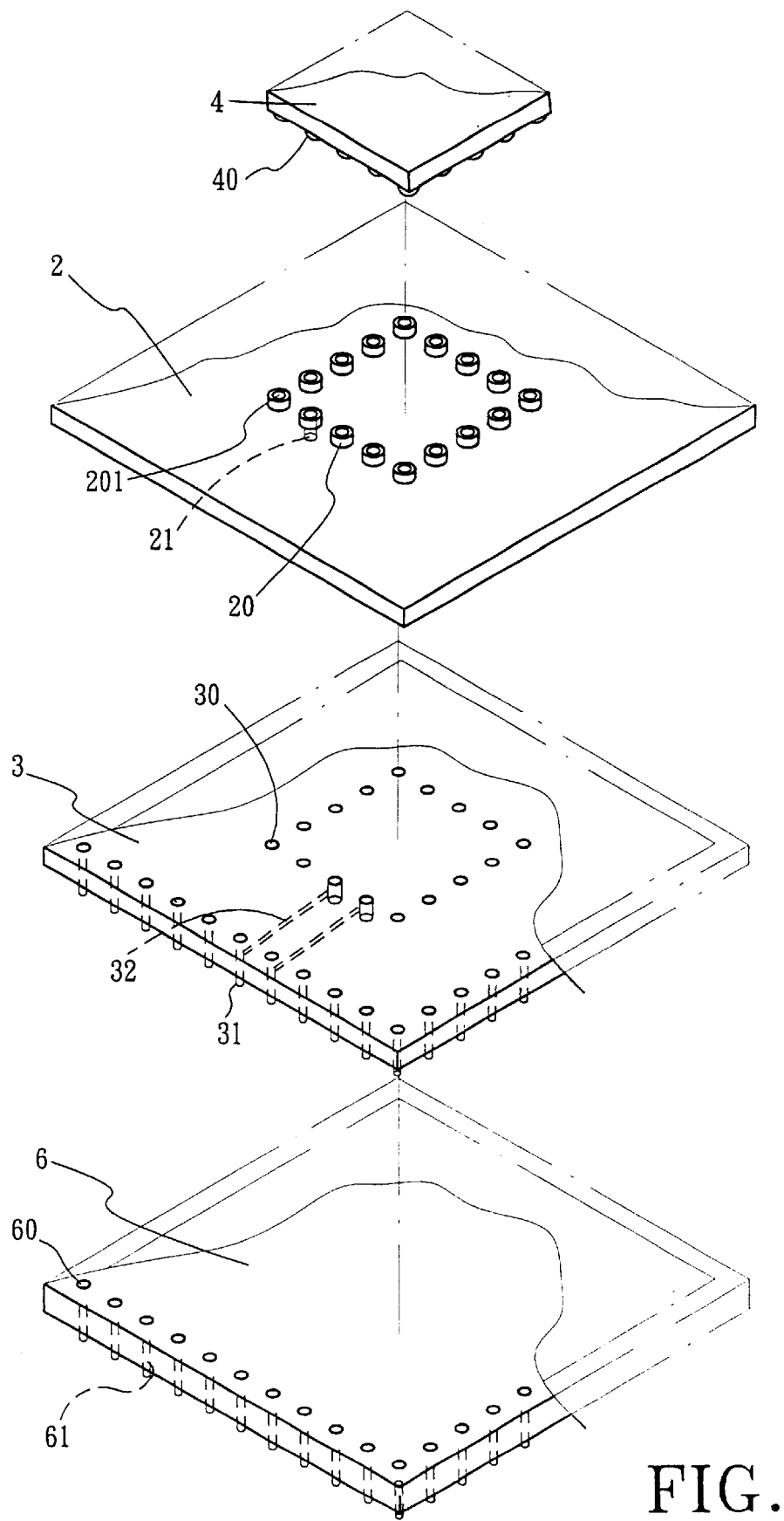
FIG. 3 is an exploded perspective view illustrating the first preferred embodiment together with a ball grid array device and a pin-type integrated circuit socket.
Figure 4:
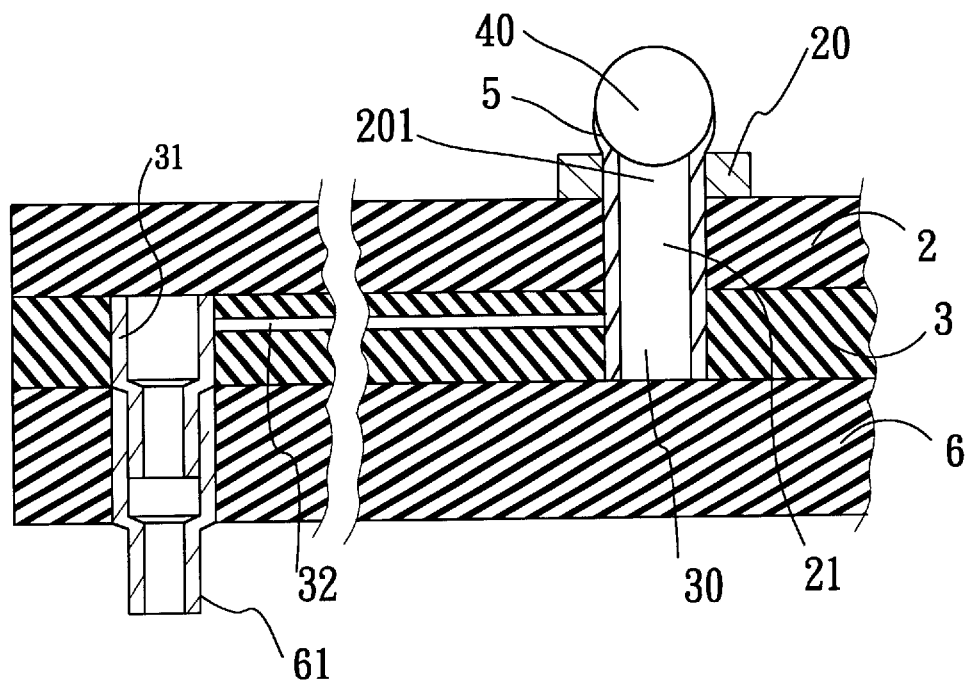
FIG. 4 is a fragmentary sectional view illustrating how the first preferred embodiment establishes connection between a solder ball of the ball grid array device and a board mounting pin of the integrated circuit socket.

Referring to FIGS. 3 and 4, the assembly of FIG. 2 is subsequently.mounted on the integrated circuit socket 6. As mentioned hereinbefore, the integrated circuit socket 6 is formed with a plurality of pin holes 60, and is provided with a plurality of board mounting pins 61 disposed in the pin holes 60 for mounting the integrated circuit socket 6 on a printed circuit board (not shown) in a known manner. The insert pins 31 extend into the pin holes 60, and contact electrically the board mounting pins 61, thereby resulting in electrical connection between the ball grid array device 4 and the integrated circuit socket 6 via the adapter.

Figure 5:
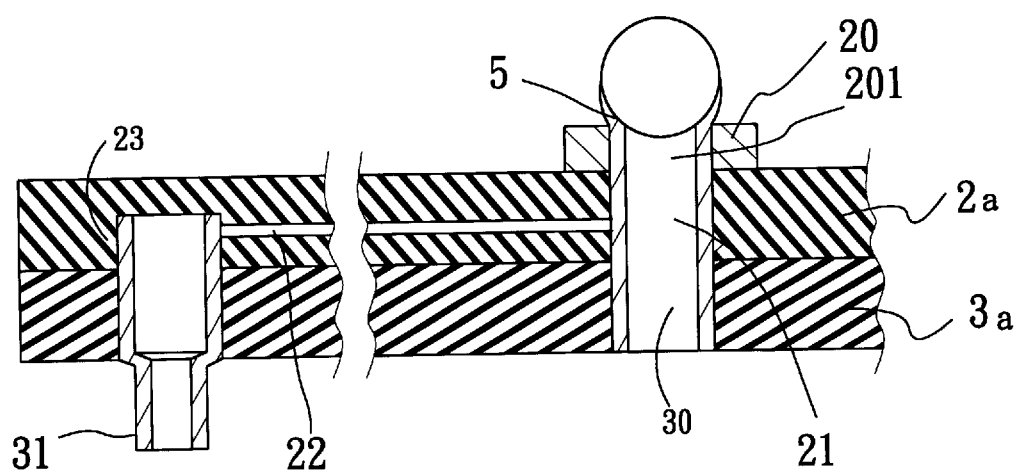
FIG. 5 is a fragmentary sectional view illustrating how connection with a solder ball of a ball grid array device is established in the second preferred embodiment of an adapter according to the present invention.

Referring to FIG. 5, the second preferred embodiment of an adapter according to the present invention is shown to similarly comprise a base plate 2a and an interfacing plate 3a. Like the previous embodiment, the base plate 2a has a device mounting side formed with a plurality of solder pads 20 (only one is shown) thereon. The solder pads 20 correspond to and are adapted for surface mounting of solder balls 40 (only one is shown) of a ball grid array device (not shown) thereon. Each solder pad 20 is annular in shape and confines a pad hole 201 therein. The base plate 2a is further formed with a plurality of upper through holes 21 (only one is shown) that are coaxial with the pad holes 201 in the solder pads 20. The interfacing plate 3a is formed with a plurality of lower through holes 30 (only one is shown) that are coaxial with the upper through holes 21. The interfacing plate 3a further has a socket confronting side with a plurality of insert pins 31a (only one is shown) depending therefrom. The insert pins 31a correspond to and are adapted for insertion into pin holes in an integrated circuit socket (not shown).

In the embodiment of FIG. 5, the insert pins 31a further extend toward the base plate 2a. The base plate 2a is further formed with a plurality of blind bores 23 (only one is shown) that receive the insert pins 31a, respectively. Each of the insert pins 31a is connected to one end of a corresponding conductor 22 that is embedded in the base plate 2a. The other end of each conductor 22 extends into a respective one of the upper through holes 21. Thus, when a solder ball 40 of the ball grid array device (not shown) is mounted on the respective solder pad 20 with the use of solder paste 5, solder melt will form a conductive coating on the walls of the coaxial holes 201, 21, 30 by virtue of gravity and will establish electrical connection between the solder pad 20 and a respective one of the insert pins 31 via a respective one of the conductors 22.

Figure 6:
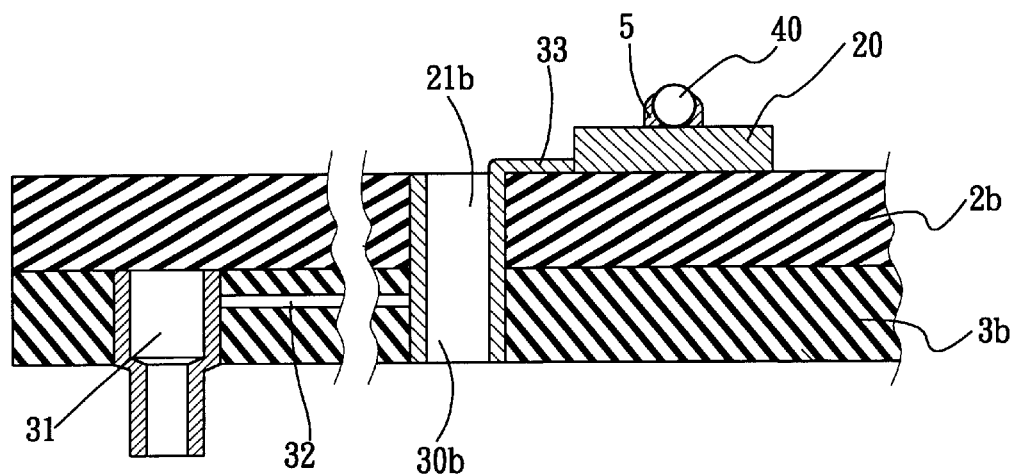
FIG. 6 is a fragmentary sectional view illustrating how connection with a solder ball of a ball grid array device is established in the third preferred embodiment of an adapter according to the present invention.

Referring to FIG. 6, the third preferred embodiment of an adapter according to the present invention is shown to comprise a base plate 2b and an interfacing plate 3b. The base plate 2b has a device mounting side formed with a plurality of solder pads 20 (only one is shown) thereon. The solder pads 20 correspond to and are adapted for surface mounting of solder balls 40 (only one is shown) of a ball grid array device (not shown) thereon. The base plate 2b is further formed with a plurality of upper through holes 21b (only is shown) that are provided with a conductive coating, and a plurality of circuit traces 33 (only one is shown) provided on the device mounting side of the base plate 2b. The circuit traces 33 connect electrically a respective one of the solder pads 20 and the conductive coating in a respective one of the upper through holes 21b. The interfacing plate 3b is formed with a plurality of lower through holes 30b (only one is shown) that are coaxial with the upper through holes 21b, and that are provided with a conductive coating to connect electrically with the conductive coating in the coaxial upper through hole 21b. The interfacing plate 3b further has a socket confronting side with a plurality of insert pins 31 (only one is shown) depending therefrom. The insert pins 31 correspond to and are adapted for insertion into pin holes in an integrated circuit socket (not shown), and are connected to one end of a corresponding conductor 32 that is embedded in the interfacing plate 3b. The other end of each conductor 32 extends into a respective one of the lower through holes 30b. Thus, when the solder balls 40 of the ball grid array device (not shown) are mounted on the solder pads 20 with the use of solder paste 5, electrical connection between the solder balls 40 and the insert pins 31 is established via the circuit traces 33, the conductive coating in the upper and lower through holes 21b, 30b, and the conductors 32.

Figure 7:
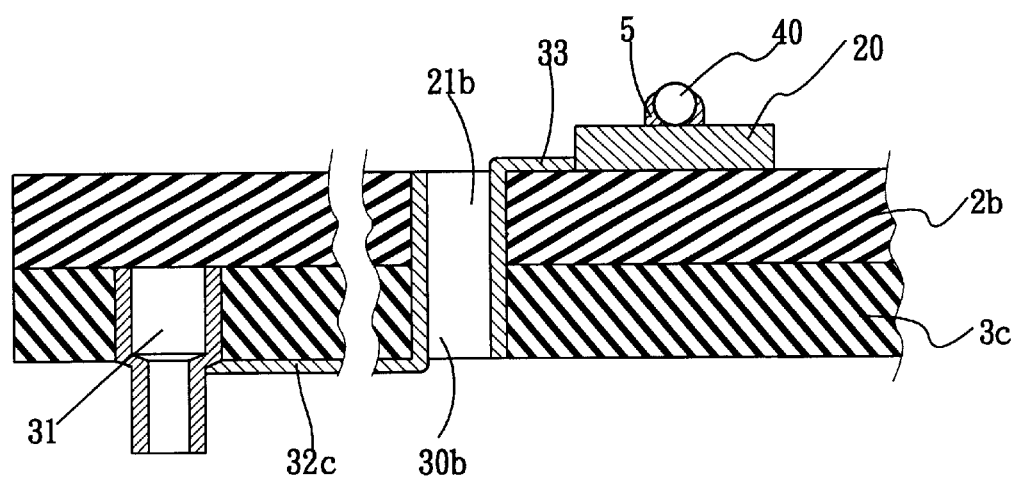
FIG. 7 is a fragmentary sectional view illustrating how connection with a solder ball of a ball grid array device is established in the fourth preferred embodiment of an adapter according to the present invention.

FIG. 7 illustrates the fourth preferred embodiment of an adapter according to the present invention. The fourth preferred embodiment is generally similar to the embodiment of FIG. 6, except that the conductors 32 (only one is shown) are not embedded in the interfacing plate 3c and are provided instead on the socket confronting side of the interfacing plate 3c.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. An adaptor for mounting a ball grid array device on a pin-type integrated circuit socket, the ball grid array device being formed with a plurality of solder balls, the integrated circuit socket being formed with a plurality of pin holes and being provided with a plurality of board mounting pins disposed in the pin holes, said adapter comprising:

a base plate having a device mounting side formed with plurality of solder pads thereon, said solder pads corresponding to and being adapted for surface mounting of the solder balls of the ball grid array device thereon, said base plate being further formed with plurality of upper through holes, each of which corresponds to one of said solder pads;

an interfacing plate formed with plurality of lower through holes that correspond respectively with said upper through holes, said interfacing plate further having a socket confronting side with a plurality of insert pins depending therefrom, said insert pins corresponding to and being adapted for insertion into the pin holes in the integrated circuit socket in order to establish electrical contact with the board mounting pins; and electrical conducting means provided on said base plate and said interface plate for connecting electrically and respectively said solder pads and said insert pins via said upper and lower through holes;

wherein each of said lower through holes is coaxial with the corresponding one of said upper through holes, said electrical conducting means including a conductive coating formed in each of coaxial ones of said upper and lower through holes.

2. The adapter as claimed in claim 1, wherein said electrical conducting means further includes a plurality of circuit traces, each of which is provided on said device mounting side of said base plate and connects electrically a respective one of said solder pads and said conductive coating in a respective one of said upper through holes and the coaxial one of said lower through holes.

3. The adapter as claimed in claim 2, wherein said electrical conducting means further includes a plurality of conductors provided on said interfacing plate, each of said conductors having one end connected to a respective one of said insert pins and an opposite end extending to a respective one of said lower through holes for connecting electrically the respective one of said insert pins and said conductive coating in the respective one of said lower through holes and the coaxial one of said upper through holes.

4. The adapter as claimed in claim 3, wherein said conductors are embedded in said interfacing plate.

5. The adapter as claimed in claim 3, wherein said conductors are provided on said socket confronting side of said interfacing plate.

\* \* \* \* \*